US006451713B1

United States Patent
Tay et al.

(10) Patent No.: US 6,451,713 B1
(45) Date of Patent: Sep. 17, 2002

(54) UV PRETREATMENT PROCESS FOR ULTRA-THIN OXYNITRIDE FORMATION

(75) Inventors: Sing-Pin Tay, Fremont; Yao Zhi Hu, San Jose; Sagy Levy, Sunnyvale, all of CA (US); Jeffrey Gelpey, Peabody, MA (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 09/836,620

(22) Filed: Apr. 17, 2001

Related U.S. Application Data

(60) Provisional application No. 60/197,575, filed on Apr. 17, 2000.

(51) Int. Cl.$^7$ ............................................. H01L 21/31
(52) U.S. Cl. ..................... 438/791; 438/792; 438/786; 438/778; 438/770; 438/787
(58) Field of Search .............................. 438/791, 792, 438/786, 778, 770, 787

(56) References Cited

U.S. PATENT DOCUMENTS

| | | | | |
|---|---|---|---|---|
| 4,581,622 A | * | 4/1986 | Takasaki et al. | 357/23.5 |
| 5,178,682 A | | 1/1993 | Tsukamoto et al. | |
| 5,534,107 A | * | 7/1996 | Gray et al. | 156/657 |
| 5,578,848 A | | 11/1996 | Kwong et al. | |
| 6,020,024 A | * | 2/2000 | Maiti et al. | 427/348.1 |
| 6,121,130 A | * | 9/2000 | Chua et al. | 438/623 |
| 6,153,504 A | * | 11/2000 | Shields et al. | 438/613 |
| 6,291,866 B1 | * | 9/2001 | Wallace et al. | 257/410 |
| 6,291,867 B1 | * | 9/2001 | Wallace et al. | 257/410 |
| 6,326,231 B1 | * | 12/2001 | Subramanian et al. | 438/72 |

FOREIGN PATENT DOCUMENTS

EP   0 227 839   7/1987

OTHER PUBLICATIONS

Lucovsky, et al., "Bonding Constraints and Defect Formation At Interfaces Between Crystalline Silicon and Advanced Single Layer and Composite Gate Dielectrics" *Applied Phys. Lett.* W. 74, No. 14 (Apr. 15, 1999).

Rosato, J.J. et al. "Ultra–high Capacitance Nitrie Films Utilizing Passivaton on Rugged Polysilicon" *J. Electrochem Soc.*, Manchester, NH, vol. 139, No. 12 (Dec. 1, 1992).

Y. Hu, et al., "Real Time INvestigation o fNucleation an Growth of Silicon on Silicon Dioxide Using Silane and Disilane in a Rapid Thermal Processing System," *J. Vac Sci Technol.* B 14(2) Mar./Apr. 1996 pp. 774–749.

M. Copel, et al.. "Nucleation of Chemical Vapor Deposited Silicon Nitride on Silicon Dioxide," *Applied Physics Letters* vol. 74, No. 13, Mar. 29, 1999. pp. 1830–1832.

H. Reisinger, et al., "Electrical Breakdown Induced By Silicon Nitride Roughness in Thin Oxide–Nitride–Oxide Films," *J. Applied Physics*, vol. 79, NO. 6, pp. 3028–3035 (Mar. 15, 1996).

Hu, et al., "In Situ Surface Pretreatment Effect on Nucleation and Film Structure of Polysilicon in a RTCVD System." $4^{th}$ Int'l Conf. Advanced Themal Processing of Semiconductors, RTP '96 pp. 128–135 (1996).

* cited by examiner

Primary Examiner—Caridad Everhart
Assistant Examiner—V. Yevsikov
(74) Attorney, Agent, or Firm—Connolly Bove Lodge & Hutz LLP

(57) ABSTRACT

The oxynitride or oxide layer formed on a semiconductor substrate is pre-treated with UV-excited gas (such as chlorine or nitrogen) to improve the layer surface condition and increase the density of nucleation sites for subsequent silicon nitride deposition. The pre-treatment is shown to reduce the root mean square surface roughness of thinner silicon nitride films (with physical thicknesses below 36 Å, or even below 20 Å that are deposited on the oxynitride layer by chemical vapor deposition (CVD).

14 Claims, 3 Drawing Sheets

UV PRETREATMENT PROCESS FOR ULTRA-THIN OXYNITRIDE FORMATION

CROSS-REFERENCE TO RELATED APPLICATION

This application claims priority from U.S. Provisional application Ser. No. 60/197,575, filed Apr. 17, 2000.

FIELD OF THE INVENTION

The present invention relates generally to processes for minimizing the surface roughness of ultra-thin dielectric films for ULSI applications. The processes have particular advantage when used for forming silicon nitride films on silicon semiconductor substrates with chemical vapor deposition (CVD) techniques.

BACKGROUND OF THE INVENTION

As the channel length of the metal-oxide-semiconductor field-effect transistors (MOSFET) is reduced, the gate dielectric thickness must be reduced in order to maintain acceptable short-channel effects and to maximize drain current. The fundamental limit to the scaling of thin silicon dioxide ($SiO_2$) is the large leakage current due to direct tunneling. The gate oxide layer is typically formed by thermal oxidation of a silicon semiconductor substrate in a substantially pure oxygen atmosphere. In ultra large scale integrated (ULSI) circuits, however, such gate oxide layers in the MOSFET can exhibit undesirable characteristics, such as relatively high defect densities and charge trapping, and relatively low reliability and low resistance to hot carrier effects.

Various in-situ multi-layer gate stack processes have been used to improve gate dielectric characteristics. One example includes an in-situ dry cleaning of the silicon semiconductor substrate, followed by a sequence of rapid thermal processing (RTP). The in-situ dry cleaning process typically comprises three steps: (1) applying UV-ozone (100 Torr pressure); (2) applying HF-methanol vapor (100 Torr pressure); and (3) applying UV-chlorine (10 Torr pressure). The UV-ozone and UV-$Cl_2$ dry cleaning removes organic residues and metallic contaminants, respectively, from the substrate surface to prepare the surface for subsequent deposits of desired gate dielectric layers. The HF-methanol vapor removes any surface oxides formed during the UV-ozone treatment. Once the substrate surface has been cleaned, it is subjected to a series of RTP processes that may consist of: (1) growing an oxynitride layer with nitric oxide (NO); (2) depositing a silicon nitride ($SiN_x$) layer with a rapid thermal chemical vapor deposition (RTCVD) process; (3) rapid thermal annealing the substrate with the SiN layer in an ammonia ($NH_3$) environment; and (4) rapid thermal annealing the substrate in an $N_2O$ environment.

The surface roughness of a CVD silicon nitride film deposited on a silicon dioxide layer has been found undesirably high (i.e., root mean square (RMS) roughness of about 10 Å and even up to 20 Å when the physical thickness of the nitride layer is about 25 Å and below. Published research papers have indicated that the coalescence of nitride nucleation islands does not take place until the silicon nitride film physical thickness exceeds about 20 Å. See H. Resinger and A. Spitzer, "Electrical Breakdown Induced by Silicon Nitride Roughness in Thin Oxide-Nitride-Oxide Films," *J. Appl. Phys.*, V. 79, p. 3028 (1996); M. Copel, et. al., "Nucleation of Chemical Vapor Deposited Silicon Nitride on Silicon Dioxide," *Appl. Phys. Lett.*, V. 74, p. 1830 (1999); and Y. Hu, et al., "An In-Situ Real Time Measurement of the Incubation Time for Si Nucleation on $SiO_2$ in a Rapid Thermal Process," *Appl. Phys. Lett.*, V. 66, p. 700 (1995). Thus, because the growth of silicon nitride films on oxide layers appears to be dependent upon having sufficient nucleation sites, thinner nitride films have had unacceptable surface roughness leading to unacceptable gate dielectric characteristics.

One proposed solution to resolve this problem uses low energy ion beams ($N^-$, $H^+$ or $He^+$) to pre-treat the oxynitride surface and increase nucleation sites. Y. Hu, et al., "In-situ Surface Pretreatment Effect on Nucleation and Film Structure of Polysilicon in a RTCVD System," 4$^{th}$ Int'l Conf. Advanced Thermal Processing of Semiconductors, RTP '96, p. 128 (1996). More recently, some studies showed that remote plasma oxidation may improve the ultra-thin oxide interface. See Lucovsky, et al., *Appl. Phys. Lett.*, V. 74, p. 2005 (1999). Unfortunately, remote plasma oxidation requires special processing equipment and is complicated to use. Alternative approaches to create more nucleation sites and reduce surface roughness of thin silicon nitride films are still being sought.

SUMMARY OF THE INVENTION

In this invention, we use UV-excited gas (preferably chlorine($Cl_2$), nitrogen ($N_2$) and mixtures of $Cl_2$ and $N_2$) to pre-treat the oxide or oxynitride film formed on a semiconductor substrate surface to create more nucleation sites for CVD nitride deposition. In our process, after an oxynitride layer is formed on a semiconductor substrate (preferably a silicon semiconductor substrate), the oxynitride layer is treated with UV-excited gas. Then, after such pre-treatment, a silicon nitride film is deposited over the treated oxynitride layer. Preferably, the oxynitride layer is formed using rapid thermal processing at a temperature of at least about 800° C. Preferably, the silicon nitride film is deposited onto the oxynitride layer using chemical vapor deposition (CVD) processing at a temperature in the range of about 700° C. to about 850° C., most preferably 700° C. to 800° C., and at a pressure in the range of about 1.5 Torr to about 3 Torr, and with a gas flow ratio of 1:40:50 of $SiH_4$:$NH_3$:Ar.

We have found that the surface roughness of the silicon nitride film is substantially reduced following such pre-treatment. In one example, when a 22.6 Å thick silicon nitride layer (physical thickness) was deposited on an untreated oxide, the surface roughness RMS was 9.2 Å. By contrast, when a 22.5 Å thick silicon nitride layer (physical thickness) was deposited on an oxide layer that had been pre-treated with UV-excited chlorine gas, the surface roughness was reduced to RMS 2.1 Å. The process thus improved the quality of the layer that was deposited.

The UV-excited gas pretreatment step may be used to prepare the semiconductor surface to receive the nitric oxide treatment to grow an oxynitride layer. The pretreatment step according to the invention is conducted prior to the silicon nitride deposition step to enhance nucleation site density and prepare the oxynitride surface layer for silicon nitride processing.

DETAILED DESCRIPTION OF A PREFERRED EMBODIMENT

Figure 1:
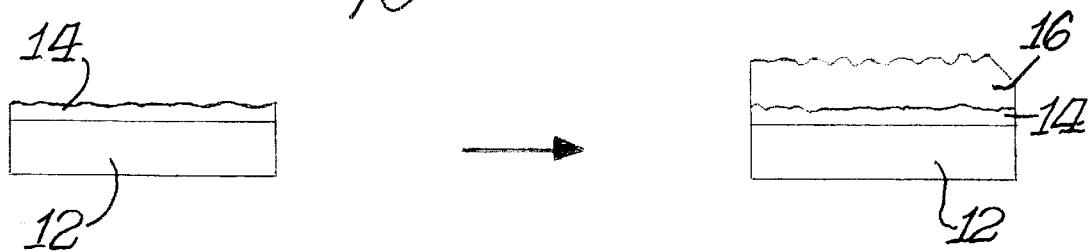
FIG. 1 is a schematic representation of a prior art process wherein a silicon nitride film is applied directly onto an oxynitride layer without a pre-treatment step.

FIG. 1 depicts in schematic form the known prior art process for forming a silicon nitride layer over an oxide or oxynitride layer on a semiconductor substrate. The silicon semiconductor substrate 12 has deposited thereon an oxynitride layer 14, typically by exposing the semiconductor substrate 12 to a nitric oxide (NO) atmosphere to oxidize the silicon surface. The oxynitride thickness is estimated to be ordinarily about 6 Å based on analysis of ellipsometric and electrical data of the final gate stack. Thereafter, a silicon nitride film 16 is deposited over the oxynitride layer using a rapid thermal chemical vapor deposition (CVD) process. The semiconductor substrate 12 with oxynitride layer 14 is exposed to a mixture of silane ($SiH_4$), ammonia ($NH_3$) and argon (Ar) in a closed chamber at a pressure of about 1.5 Torr. While held at that pressure and in that gaseous environment, the substrate is heated to a temperature of about 800° C. The CVD processing can last for a pulse (1 second) up to a few minutes. Typical processing times are from 5 to 60 seconds. The silicon nitride film 16 formed over the oxynitride layer has a physical thickness of about 36 Å down to about 20 Å. This gate stack should have an equivalent silicon oxide ($SiO_2$) thickness (EOT) from about 24 Å down to about 16 Å. In view of the advances in gate dielectric technology, very thin silicon nitride films of 20 Å and under in physical thickness are desired in the next generation of ULSI devices.

Figure 2:
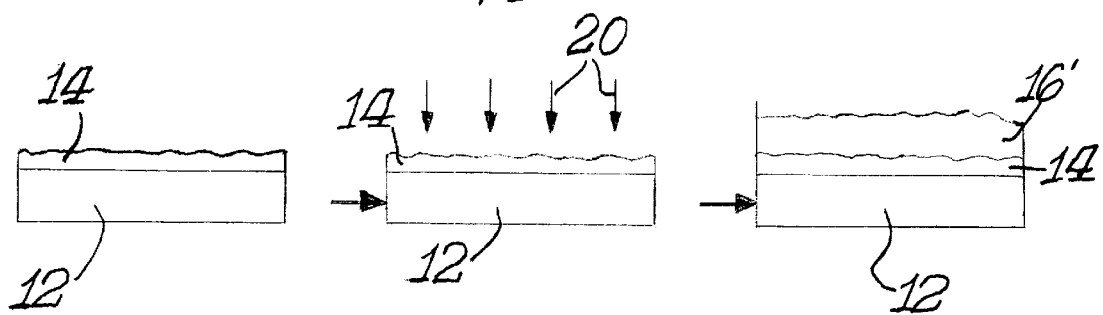
FIG. 2 is a schematic representation of the process of the invention wherein the oxynitride layer is treated with UV-excited gas prior to applying a silicon nitride film so as to create more nucleation sites and reduce the surface roughness.

FIG. 2 depicts in schematic form the process according to the invention. An UV-excited gas pre-treatment step takes place before the silicon nitride film is deposited on the oxynitride layer. Like reference numerals refer to like components in FIGS. 1 and 2. As shown in FIG. 2, the UV-excited gas 20 is applied to the surface of the oxynitride layer 14 on the semiconductor substrate 12. By interposing this pre-treatment step, the surface condition of the oxynitride layer is improved before the silicon nitride film is deposited. In this way, the surface roughness of the silicon nitride film 16' is reduced, leading to improved further processing. To illustrate this advantage, the peaks and valleys on the upper surface of the silicon nitride film 16' shown in FIG. 2 are less pronounced than the peaks and valleys on the silicon nitride film 16 surface shown in FIG. 1.

According to the invention, the oxynitride layer surface is modified or conditioned with an LTV-excited gas prior to depositing the silicon nitride film onto the oxynitride layer. In the preferred embodiment the pre-treatment is carried out using UV-excited $Cl_2$ or $N_2$ or mixtures of these gases. UV-excited chlorine gas is especially preferred. To obtain the UV-excited gas, UV radiation is emitted from an external Xenon lamp with a broad wavelength (200–1100 nm) output. Preferably, the photon energies from a Xenon lamp are 6.2–1.1 eV, which are higher than most bond energies for semiconductor substrates, such as: Si—Si=3.1 eV; Si—H= 3.0 eV; Si—Cl=3.9 eV; Si—N=4.0 eV; Si—O=4.6 eV. These bonds can be dissociated under UV radiation, but they would not be ionized because their ionization potentials far exceed 10 eV.

The preferred process includes the following steps:

(1) optionally dry clean the surface of the semiconductor substrate, preferably a silicon semiconductor substrate, with UV-excited ozone to remove organic residues, followed by HF-methanol vapor treatment to remove any grown oxide, and then use UV-excited chlorine to remove metallic contaminants;

(2) expose the semiconductor substrate surface to an atmosphere of nitric oxide at a pressure from about 0.5 to 500 Torr, most preferably 0.5 to 100 Torr, and at a temperature of from 800° C. to about 1000° C. to thermally grow an oxynitride layer;

(3) pre-treat the oxynitride layer with Uv-excited gas, such as UV-excited chlorine or nitrogen or mixtures, by exposing the oxynitride layer to the UV-excited gas for 30 seconds up to two minutes at a temperature in the range of about 80° C. to 160° C. and at a pressure from about 5 Torr to about 20 Torr; and (4) deposit a film of silicon nitride over the pretreated oxynitride layer using a chemical vapor deposition process in which the semiconductor substrate coated with an oxynitride layer is held within an atmosphere of $SiH_4$:$NH_3$:Ar preferably in amounts in a ratio of from 1:20–50:40–60, preferably 1:40:50, at a temperature in the range of 700° C. to 850° C., and at a pressure in the range of from about 1.5 Torr to about 3 Torr, for from 5 to 35 seconds, preferably 20 seconds.

With this process of silicon nitride deposition, surface roughness as measured by root mean square (RMS) is reduced substantially when the pretreatment step is included prior to depositing the silicon nitride film over the oxynitride layer. As an additional advantage of the invention, we have found that as the thickness of the silicon nitride layer increases, the surface roughness may still increase, but at a lesser rate than is shown for layers deposited without the intervening pre-treatment step. Thus improvement in the surface condition is expected even when thicker silicon nitride films (greater than 30 Å physical thickness) are intended. Accordingly, the invention is not limited to use when forming ultra thin nitride films.

Figure 3A:
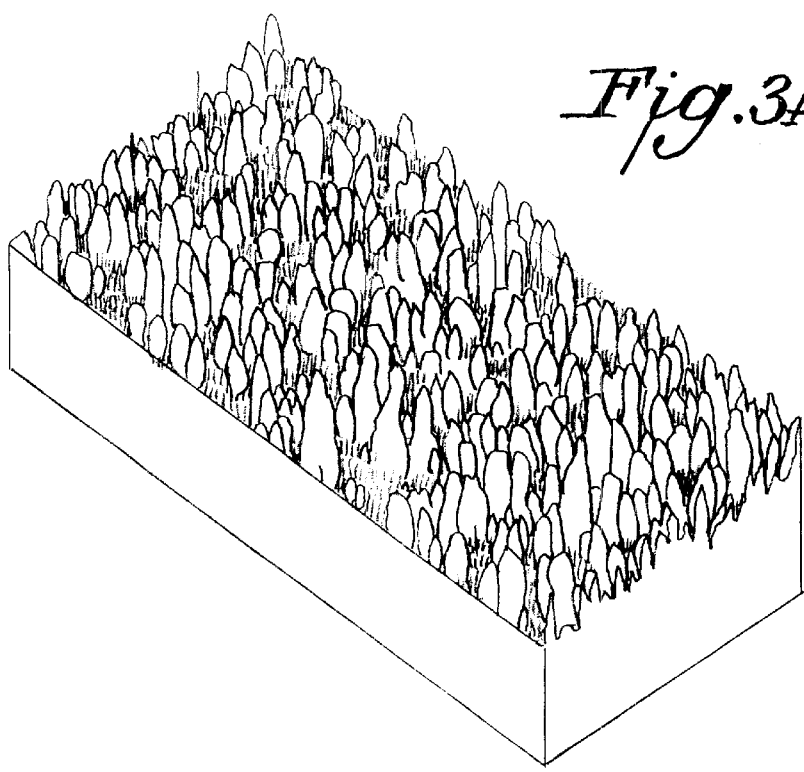
FIGS. 3A and 3B are schematic representations showing the surface morphology of CVD-deposited silicon nitride films with (FIG. 3B) and without (FIG. 3A) UV-excited chlorine gas pre-treatment of the oxynitride layer.
Figure 3B:
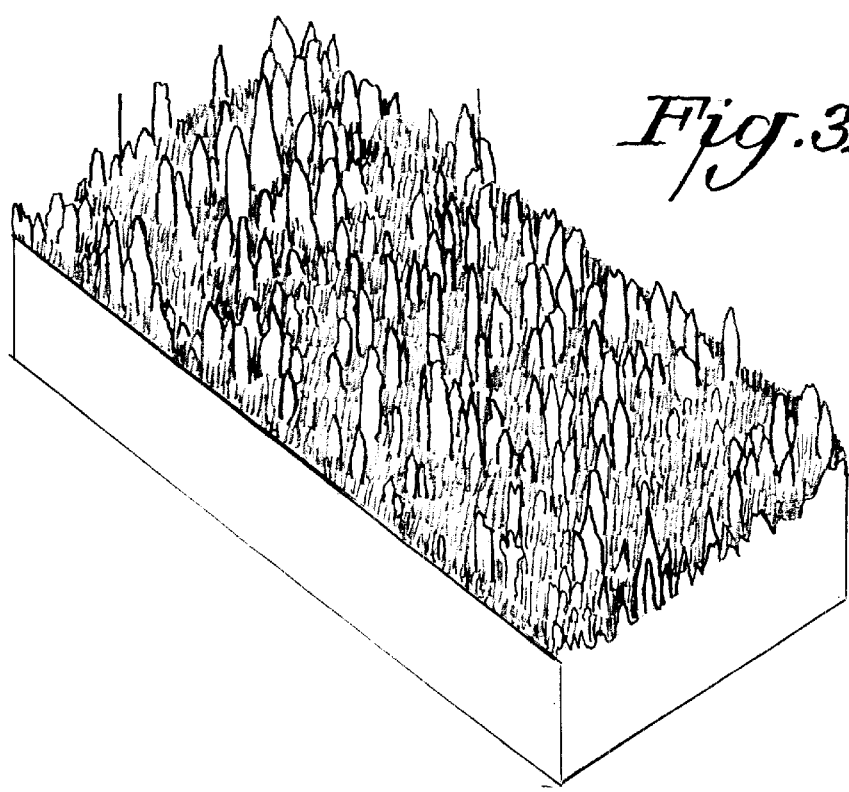

FIGS. 3A and 3B compare the actual surface morphology obtained when a silicon nitride film was deposited over an oxynitride layer with and without a UV-excited chlorine gas pretreatment according to the invention. These Figures were sketched from representative atomic force miscroscopy (AFM) views of actual semiconductor substrates with silicon nitride films deposited thereon with (FIG. 3B) and without (FIG. 3A) processing according to the invention. All processing steps were carried out under the same conditions, except that the sample in FIG. 3B was subjected to UV-excited chlorine gas pretreatment of the oxynitride layer for 60 seconds before chemical vapor deposition processing to grow a silicon nitride film on the oxynitride layer. In FIG. 3A, the semiconductor sample had a deposited nitride film with a physical thickness of 23.5 Å and the surface roughness was RMS 20 Å. As shown in FIG. 3A, numerous elevated peaks or discontinuities appear on the nitride film surface, indicating a rough surface. By contrast, in FIG. 3B, the deposited silicon nitride film had a physical thickness of 28.7 Å and a surface roughness of RMS 10 Å. The pretreatment with UV-excited chlorine gas permitted a more uniform nitride layer with fewer elevated peaks or discontinuities, and a smoother film surface.

Experiments were conducted to compare the processes according to the invention with known processes. The results of these Examples are shown below in Table I.

TABLE I

| | Oxynitride grown in NO ambient | Pre-deposition Treatment | | CVD SiN$_x$ Deposition Conditions (Ar = 500 sccm) | | | | | SE** physical | AFM*** Roughness |
|---|---|---|---|---|---|---|---|---|---|---|
| Example | Press. (Torr)/ Temp. (° C.)/ Time (s) | UV-Cl$_2$ UV-N$_2$ | Press. (Torr)/ Temp. (° C.)/ Time (s) | SiH$_4$ (sccm) | NH$_3$ (sccm) | Temp. (° C.) | Press. (Torr) | Time (sec.) | thickness SiN$_x$ (Å) | RMS (Å) |
| UV-1 | 0.5T/800° C./0s | UV-Cl$_2$ | 10T/100° C./120s | 10 | 403 | 800 | 1.5 | 25 | 22.5 | 2.1 |
| UV-2 | 0.5T/800° C./0s | UV-N$_2$ | 10T/100° C./120s | 10 | 403 | 800 | 1.5 | 25 | 24.0 | 4.2 |
| UV-3 | 100T/800° C./10s | UV-Cl$_2$ | 10T/160° C./60s | 10 | 400 | 800 | 1.5 | 25 | 28.7 | 10.3 |
| S-1 | 100T/800° C./10s | None | — | 10 | 403 | 800 | 1.5 | 25 | 22.6 | 9.2 |
| S-2 | 100T/800° C./10s | None | — | 10 | 400 | 800 | 1.5 | 25 | 23.5 | 20.0 |
| S-3 | 100T/800° C./10s | None | — | 10 | 400 | 800 | 1.5 | 35 | 21.8 | 5.9 |

**Spectroscopic ellipsometry measurements
***Atomic Force microscopy measurements As demonstrated in the Examples, the coalescence of nucleation islands should take place at thinner nitride thickness. The RMS roughness is 2.10 Å for silicon nitride (thickness=22.5 Å) deposited after a low pressure (0.5 Torr) NO oxynitridation and UV-Cl$_2$ pretreatment, whereas it is 9.2 Å for nitride (22.6 Å film thickness) deposited after a standard (100 Torr) NO oxynitridation only. Compare Example UV-1 to Example S-1.

Figure 4:
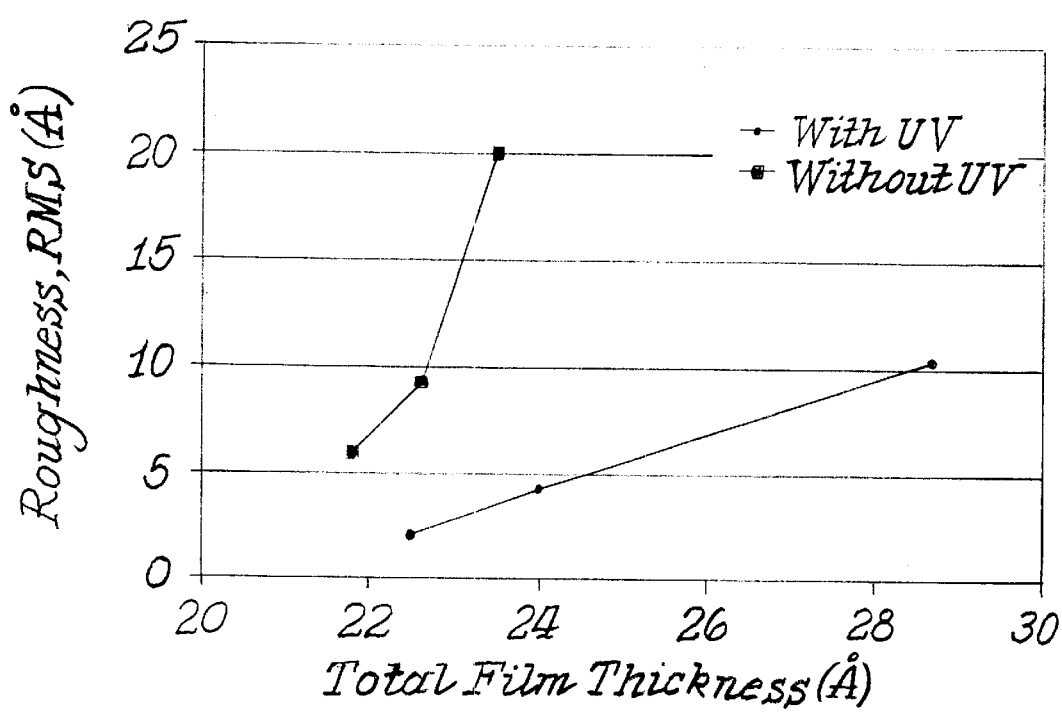
FIG. 4 is a graph comparing film roughness for processes with and without UV pre-treatment.

FIG. 4 shows graphically the results reported in Table I, plotting roughness versus total film thickness of the SiN$_x$ films deposited with CVD. The UV-treatment of the oxynitride layer reduces significantly the CVD-deposited nitride roughness.

The foregoing description of the invention illustrates and describes the preferred embodiments. Nevertheless, it is to be understood that the invention is capable of use in various other combinations, modifications, and environments, and is capable of changes or modifications within the scope of the inventive concept that has been expressed herein. The description is not intended to limit the invention to the form disclosed here. Alternate embodiments apparent to those skilled in the art are to be included within the scope of the appended claims.

We claim:

1. A process for forming a silicon nitride film on the surface of a semiconductor substrate, comprising:
   treating a thin layer of oxynitride formed on the semiconductor substrate with a UV-excited gas selected from the group consisting of chlorine and nitrogen and mixtures thereof; and
   depositing a film of silicon nitride over the treated oxynitride layer.

2. The process of claim 1, wherein the thin layer of oxynitride has a physical thickness of from about 6 Å to about 10 Å.

3. The process of claim 2, wherein the oxynitride layer is formed on a silicon semiconductor substrate using rapid thermal processing at a temperature of at least 800° C.

4. The process of claim 1, wherein the UV-excited gas is introduced at a pressure from about 5 to 20 Torr and at a temperature above about 80° C.

5. The process of claim 1, wherein the UV-excited gas is applied to treat the oxynitride layer for at least 30 seconds.

6. The process of claim 1, wherein the silicon nitride film has a physical thickness of 30 Å or less.

7. The process of claim 6, wherein the silicon nitride film is deposited using chemical vapor deposition at a temperature in the range of about 700° C. to 850° C.

8. The process of claim 7, wherein the chemical vapor deposition is carried out at a pressure of from about 1.5 Torr to about 3.0 Torr with a gas flow ratio of about 1:40:50 of SiH$_4$:NH$_3$:Ar.

9. The process of claim 1, wherein the silicon nitride film has a physical thickness in the range of from about 20 Å to about 36 Å.

10. The process of claim 1, wherein the UV-excited gas is chlorine.

11. A process for reducing the root mean square (RMS) surface roughness of a silicon nitride film formed on a semiconductor substrate, comprising:
    treating a layer of oxynitride formed on the semiconductor substrate with a UV-excited gas selected from the group consisting of chlorine, nitrogen and mixtures thereof, before depositing a film of silicon nitride over the treated oxynitride layer.

12. The process of claim 11, wherein the oxynitride layer has a physical thickness of from about 6 Å to about 10 Å.

13. The process of claim 11, wherein the UV-excited gas is introduced at a pressure from about 5 to about 20 Torr and at a temperature above 80° C.

14. The process of claim 11, wherein the UV-excited gas is applied to treat the oxynitride layer for at least 30 seconds.

* * * * *

UNITED STATES PATENT AND TRADEMARK OFFICE
CERTIFICATE OF CORRECTION

PATENT NO.    : 6,451,713 B1  
DATED         : September 17, 2002  
INVENTOR(S)   : Sing-Pin Tay et al.

Page 1 of 1

It is certified that error appears in the above-identified patent and that said Letters Patent is hereby corrected as shown below:

<u>Column 6,</u>  
Line 55, after claim 14, please add the following claims:

15. The process of claim 11, wherein the silicon nitride film has a physical thickness of 30 Å or less.

16. The process of claim 15, wherein the silicon nitride film has a physical thickness of from about 20 Å to about 36 Å.

17. The process of claim 11, wherein the root mean square surface roughness of the silicon nitride film is less than about 5 Å.

18. The process of claim 11, wherein the oxynitride layer is formed on a silicon semiconductor substrate using rapid thermal processing at a temperature of at least 800 °C.

19. The process of claim 11, wherein the silicon nitride film is deposited using chemical vapor deposition at a temperature in the range of about 700 °C to about 850 °C.

20. The process of claim 18, wherein the chemical vapor deposition is carried out at a pressure of from about 1.5 Torr to about 3.0 Torr with a gas flow ratio of about 1:40:50 of $SiH_4:NH_3:Ar$.

21. The process of claim 11, wherein the UV-excited gas is chlorine.

Signed and Sealed this

Seventh Day of January, 2003

JAMES E. ROGAN  
*Director of the United States Patent and Trademark Office*